(12) United States Patent
Chang et al.

(10) Patent No.: US 11,002,927 B2
(45) Date of Patent: May 11, 2021

(54) PACKAGE STRUCTURE

(71) Applicant: Taiwan Semiconductor Manufacturing Co., Ltd., Hsinchu (TW)

(72) Inventors: Chia-Lun Chang, Tainan (TW); Ching-Hua Hsieh, Hsinchu (TW); Cheng-Ting Chen, Taichung (TW); Hsiu-Jen Lin, Hsinchu County (TW); Hsuan-Ting Kuo, Taichung (TW); Chia-Shen Cheng, Hsinchu County (TW); Chih-Chiang Tsao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/281,090

(22) Filed: Feb. 21, 2019

(65) Prior Publication Data
US 2020/0271873 A1 Aug. 27, 2020

(51) Int. Cl.
*G02B 6/42* (2006.01)
*H01L 21/683* (2006.01)
(Continued)

(52) U.S. Cl.
CPC .......... *G02B 6/428* (2013.01); *G02B 6/4214* (2013.01); *G02B 6/4253* (2013.01); *G02B 6/43* (2013.01); *H01L 21/561* (2013.01); *H01L 21/565* (2013.01); *H01L 21/6835* (2013.01); *H01L 23/3128* (2013.01); *H01L 23/5386* (2013.01); *H01L 24/24* (2013.01); *H01L 24/82* (2013.01); *H01L 24/96* (2013.01); *H01L 25/18* (2013.01); *H01L 25/50* (2013.01); *H05K 1/0274* (2013.01); *H05K 1/181* (2013.01); *H01L 21/568* (2013.01); *H01L 2221/68359* (2013.01); *H01L 2221/68372* (2013.01); *H01L 2221/68381* (2013.01); *H01L 2224/215* (2013.01); *H01L 2224/24225* (2013.01); *H01L 2224/821* (2013.01); *H01L 2224/82005* (2013.01); *H01L 2224/95001* (2013.01); *H01L 2924/12042* (2013.01); *H01L 2924/12043* (2013.01);
(Continued)

(58) Field of Classification Search
None
See application file for complete search history.

(56) References Cited

U.S. PATENT DOCUMENTS 6,243,509 B1 *  6/2001  Chen .................. G02B 6/43
                                                385/129
6,393,169 B1 *  5/2002  Paniccia ............ G02B 6/43
                                                385/14

(Continued)

*Primary Examiner* — Tina M Wong
(74) *Attorney, Agent, or Firm* — JCIPRNET

(57) ABSTRACT

In an embodiment, a package structure including an electro-optical circuit board, a fanout package disposed over the electro-optical circuit board is provided. The electro-optical circuit board includes an optical waveguide. The fanout package includes a first optical input/output portion, a second optical input/output portion and a plurality of electrical input/output terminals electrically connected to the electro-optical circuit board. The first optical input/output portion is optically coupled to the second optical input/output portion through the optical waveguide of the electro-optical circuit board.

20 Claims, 18 Drawing Sheets

(51) Int. Cl.
*H01L 21/56* (2006.01)
*G02B 6/43* (2006.01)
*H01L 23/538* (2006.01)
*H01L 25/18* (2006.01)
*H01L 23/31* (2006.01)
*H01L 23/00* (2006.01)
*H01L 25/00* (2006.01)
*H05K 1/18* (2006.01)
*H05K 1/02* (2006.01)

(52) U.S. Cl.
CPC .............. *H05K 2201/10121* (2013.01); *H05K 2201/10151* (2013.01); *H05K 2201/2054* (2013.01)

(56) References Cited

U.S. PATENT DOCUMENTS

| | | | |
|---|---|---|---|
| 6,512,861 B2 * | 1/2003 | Chakravorty | G02B 6/42 385/14 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,057,853 B2 * | 6/2015 | Lau | G02B 6/43 |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,804,334 B2 * | 10/2017 | Israel | G02B 6/262 |
| 10,288,823 B2 * | 5/2019 | Tsujita | G02B 6/032 |
| 10,775,573 B1 * | 9/2020 | Hsu | G02B 6/4214 |
| 2006/0133718 A1 * | 6/2006 | Liu | G02B 6/43 385/14 |
| 2007/0053627 A1 * | 3/2007 | Hsu | G02B 6/12002 385/14 |
| 2007/0081760 A1 * | 4/2007 | Lu | G02B 6/2852 385/14 |
| 2007/0104413 A1 * | 5/2007 | Hsu | G02B 6/42 385/14 |
| 2007/0147842 A1 * | 6/2007 | Haney | G02B 6/2817 398/118 |
| 2008/0118200 A1 * | 5/2008 | Kim | G02B 6/43 385/14 |
| 2009/0032928 A1 * | 2/2009 | Chiang | H01L 23/481 257/686 |
| 2009/0208164 A1 * | 8/2009 | Kim | G02B 6/12002 385/14 |
| 2011/0069464 A1 * | 3/2011 | Joe | G02B 6/4214 361/783 |
| 2012/0128291 A1 * | 5/2012 | Teitelbaum | G02B 6/4214 385/14 |
| 2013/0330035 A1 * | 12/2013 | Shin | G02B 6/12 385/14 |
| 2015/0010266 A1 * | 1/2015 | Webster | G02B 6/122 385/14 |
| 2015/0036970 A1 * | 2/2015 | Lai | H01L 21/481 385/14 |
| 2016/0025944 A1 * | 1/2016 | Chen | G02B 6/43 385/14 |
| 2018/0106966 A1 * | 4/2018 | Testa | G02B 6/43 |
| 2018/0259726 A1 * | 9/2018 | Rehnstrom | H04B 10/801 |
| 2018/0335589 A1 * | 11/2018 | Jou | H01S 5/183 |
| 2020/0271873 A1 * | 8/2020 | Chang | H01L 23/3128 |
| 2020/0319405 A1 * | 10/2020 | Hsu | G02B 6/43 |

\* cited by examiner

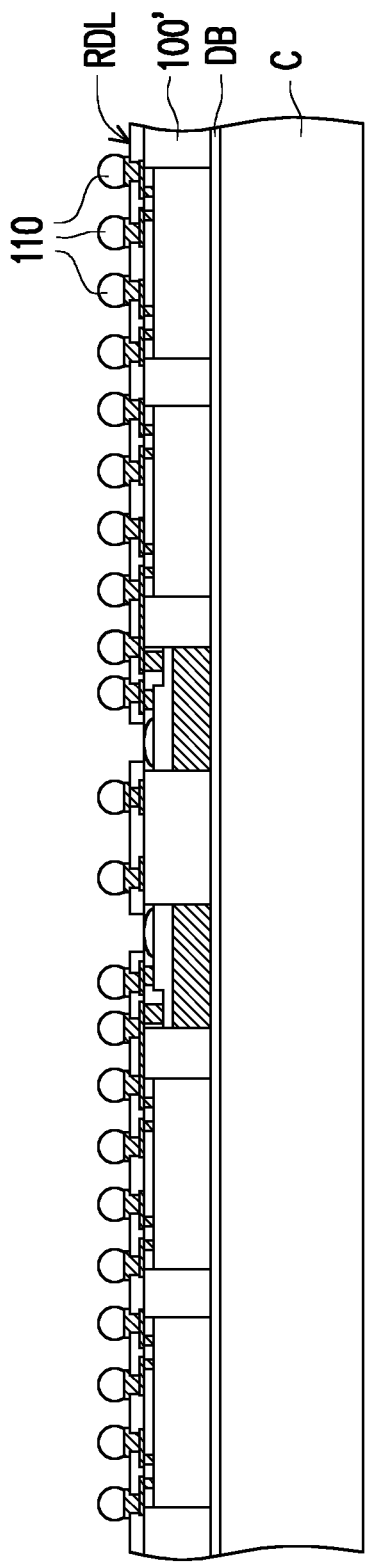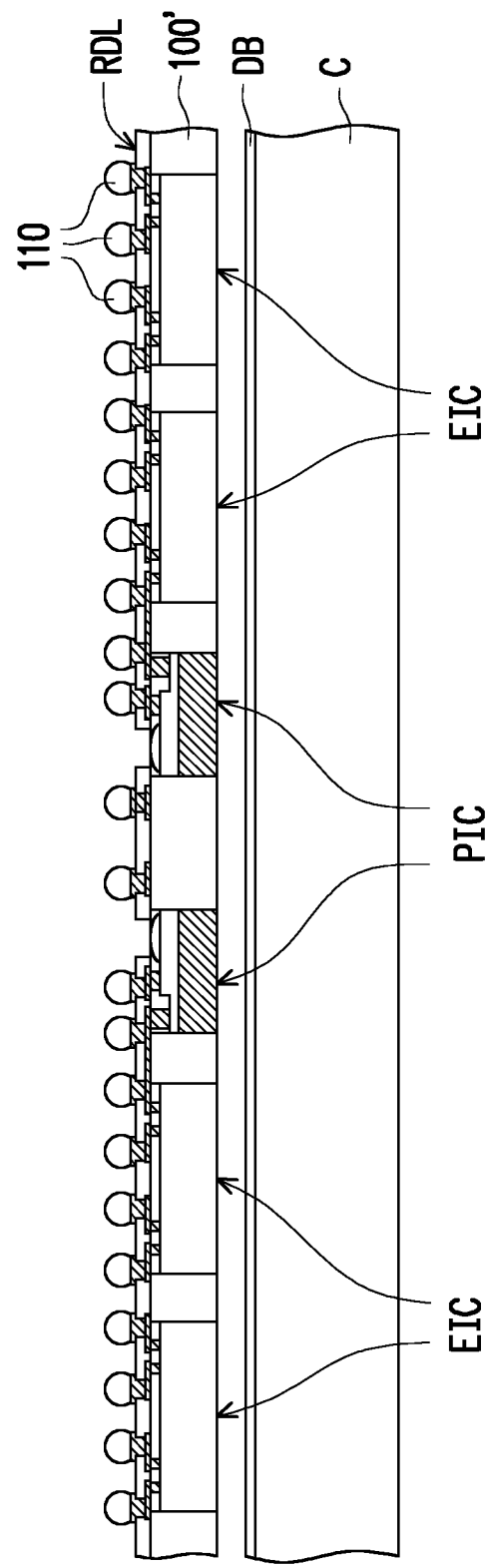

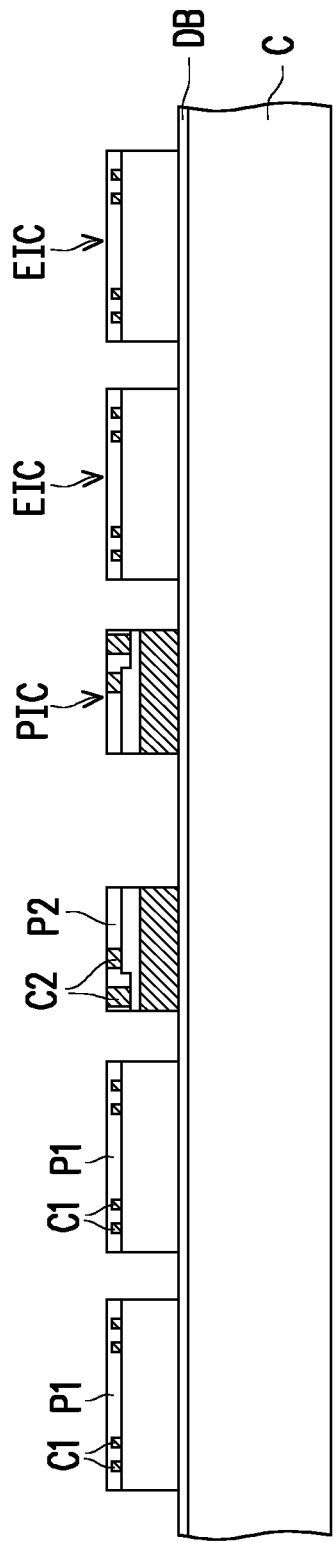
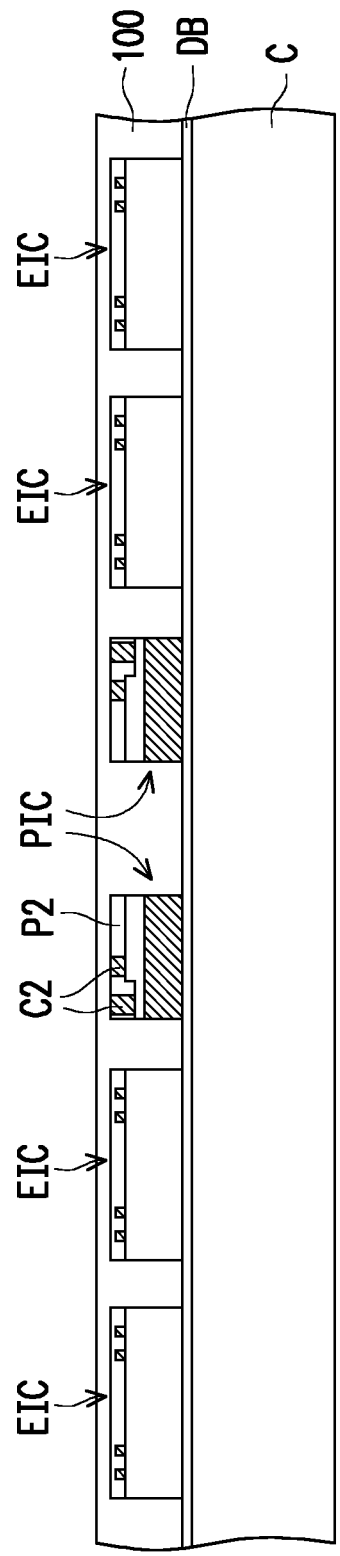
FIG. 17
FIG. 18

PACKAGE STRUCTURE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8 are cross-sectional views of intermediate steps of a process for forming an integrated fanout package in accordance with some embodiments.

FIGS. 1 through 7, FIG. 13, and FIG. 14 are cross-sectional views of intermediate steps of a process for forming another integrated fanout package in accordance with some embodiments.

FIGS. 17 through 25 are cross-sectional views of intermediate steps of a process for forming a package structure in accordance with some other embodiments.

DETAILED DESCRIPTION

Figure 1:
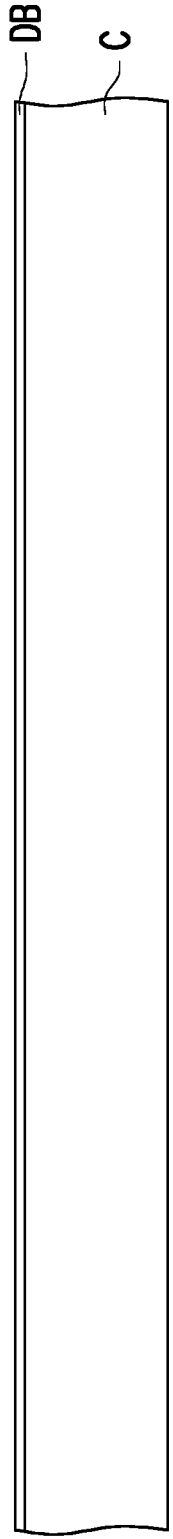

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Electrical input/output (I/O) interconnect (e.g., copper wirings) will be the bottleneck in data transmission rate as the minimum feature size in the integrated circuit dies decreases (e.g., CMOS node <7 nm). To enhance the performance (e.g., data transmission rate, I/O bandwidth, data transmission length, and so on) of a package structure, fanout technology and optical I/O interconnect may be implemented. Furthermore, by implementation of fanout technology and optical I/O interconnect, size of the package structure may be miniaturized and transmission cost may be reduced.

FIGS. 1 through 8 are cross-sectional views of intermediate steps of a process for forming an integrated fanout package in accordance with some embodiments. Referring to FIG. 1, a carrier substrate C is provided, and a de-bonding layer DB is formed on the carrier substrate C. The carrier substrate C may be a glass carrier substrate, a ceramic carrier substrate, or the like. The carrier substrate C may be a wafer, such that multiple integrated circuit dies or packages can be formed over the carrier substrate C. The de-bonding layer DB may be formed of a polymer-based material, which may be removed along with the carrier substrate C from the overlying structures that will be formed in subsequent steps. In some embodiments, the de-bonding layer DB is an epoxy-based thermal-release material, which loses its adhesive property when heated, such as a light-to-heat-conversion (LTHC) release coating. In other embodiments, the de-bonding layer DB may be an ultra-violet (UV) glue, which loses its adhesive property when exposed to UV light. The de-bonding layer DB may be dispensed as a liquid and cured, may be a laminate film laminated onto the carrier substrate C, or may be the like. The top surface of the de-bonding layer DB may be leveled and may have a high degree of planarity.

Figure 2:
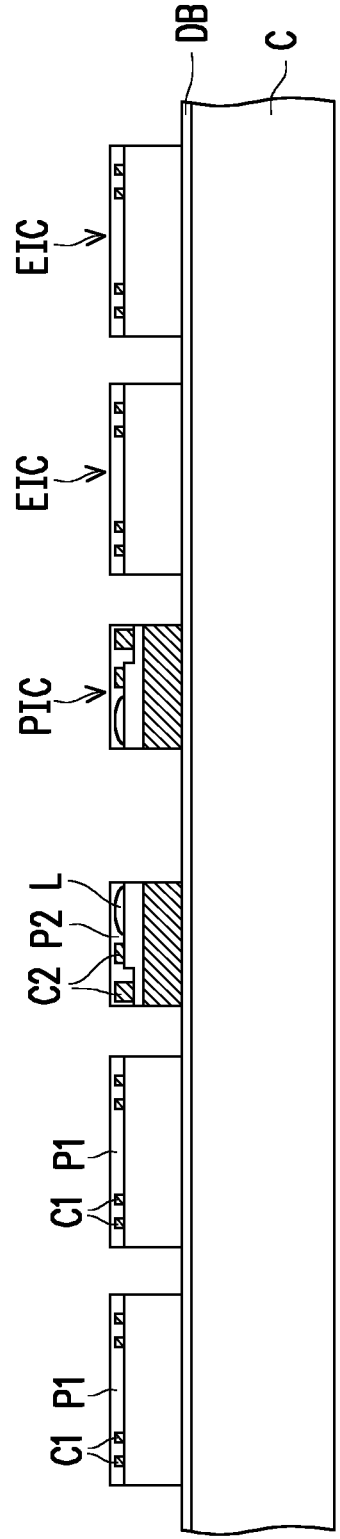

Referring to FIG. 2, a plurality of electric integrated circuit dies EIC and a plurality of photoelectric integrated circuit dies PIC are placed over the de-bonding layer DB. The electric integrated circuit dies EIC may be logic dies (e.g., central processing unit, microcontroller, etc.), memory dies (e.g., dynamic random access memory (DRAM) dies, static random access memory (SRAM) dies, etc.), power management dies (e.g., power management integrated circuit (PMIC) dies), radio frequency (RF) dies, micro-electro-mechanical-system (MEMS) dies, signal processing dies (e.g., digital signal processing (DSP) dies), front-end dies (e.g., analog front-end (AFE) dies), system-on-chip (SoC) dies, or combinations thereof. The photoelectric integrated circuit dies PIC may be photo-detectors (e.g., photo-diode arrays), optical signal sources (e.g., laser diodes), or combinations thereof. In an embodiment, the photoelectric integrated circuit dies PIC each may include condense lenses L formed therein.

In an embodiment where optical transmitters are fabricated in fanout packages, a plurality of photoelectric integrated circuit dies PIC, such as optical signal sources, and a plurality of electric integrated circuit dies EIC, such as SoC (Tx) dies, memory dies and drivers, may be placed over the de-bonding layer DB. For example, the optical signal sources include laser diodes, such as Vertical-Cavity Surface-Emitting Laser (VCSEL) diodes or the like; and the memory dies include DRAM dies, SRAM dies or the like.

In an embodiment where optical receivers are fabricated in fanout packages, a plurality of photoelectric integrated circuit dies PIC, such as photo-detectors, and a plurality of electric integrated circuit dies EIC, such as SoC (Rx) dies, memory dies and amplifiers, may be placed over the de-bonding layer DB. For example, the photo-detectors include photo-diodes; the memory dies include DRAM dies, SRAM dies or the like; and the amplifiers include transimpedance amplifiers (TIA) or the like.

In an embodiment where optical transceivers are fabricated in fanout packages, a plurality of photoelectric integrated circuit dies PIC, such as photo-detectors and optical signal sources, and a plurality of electric integrated circuit dies EIC, such as SoC (Rx) dies, SoC (Rx) dies, memory dies, drivers and amplifiers, may be placed over the de-bonding layer DB. For example, the photo-detectors include photo-diodes; the optical signal sources include laser diodes, such as Vertical-Cavity Surface-Emitting Laser (VCSEL) diodes or the like; the memory dies include DRAM dies, SRAM dies or the like; and the amplifiers include transimpedance amplifiers (TIA) or the like.

The electric integrated circuit dies EIC may each include a semiconductor substrate, with devices such as transistors, diodes, capacitors, resistors, etc., formed in and/or on the semiconductor substrate. The devices may be interconnected by interconnect structures formed by, for example, metallization patterns in one or more dielectric layers on the semiconductor substrate to form an integrated circuit. The electric integrated circuit dies EIC further comprise pads, such as aluminum pads, to which external connections are made. The pads are on what may be referred to as respective active sides of the electric integrated circuit dies EIC, and may be in uppermost layers of the interconnect structures. In addition, conductive connetors C1 may be formed on the pads. The conductive connectors C1 may be formed from a conductive material such as solder, copper, aluminum, gold, nickel, silver, palladium, tin, the like, or a combination thereof. In some embodiments, the conductive connectors C1 are copper posts. In addition, the photoelectric integrated circuit dies PIC may comprise pads, such as aluminum pads, to which external connections are made. The pads are on what may be referred to as respective active sides of the photoelectric integrated circuit dies PIC. In addition, conductive connectors C2 may be formed on the pads. The conductive connectors C2 may be formed from a conductive material such as solder, copper, aluminum, gold, nickel, silver, palladium, tin, the like, or a combination thereof. In some embodiments, the conductive connectors C2 are copper posts.

The electric integrated circuit dies EIC and the photoelectric integrated circuit dies PIC may be aligned and placed using, e.g., a pick-and-place tool. In some embodiments, the electric integrated circuit dies EIC and the photoelectric integrated circuit dies PIC are attached on the de-bonding layer DB through die attachment films (not shown), adhesion paste (not shown), or the like. After the electric integrated circuit dies EIC and the photoelectric integrated circuit dies PIC are placed on the de-bonding layer DB, top surfaces of the conductive connectors C1 and C2 may be substantially leveled.

In order to protect the conductive connetors C1 of the electric integrated circuit dies EIC from being damaged by pick-and-place tool and subsequently performed processes, protection layers P1 covering the conductive connectors C1 may be formed on the electric integrated circuit dies EIC. Furthermore, in order to protect the condense lenses L and the conductive connectors C2 of the photoelectric integrated circuit dies PIC from being damaged by pick-and-place tool and subsequently performed processes, protection layers P2 covering the condense lenses L and the conductive connectors C2 may be formed on the photoelectric integrated circuit dies PIC. The protection layers P1 and P2 are formed in advance before the electric integrated circuit dies EIC and the photoelectric integrated circuit dies PIC are placed on the de-bonding layer DB. In some embodiments, the protection layers P1 and P2 are formed by back end of line (BEOL) processes of the electric integrated circuit dies EIC and the photoelectric integrated circuit dies PIC, respectively.

As shown in FIG. 2, the condense lenses L and the conductive connectors C2 are formed prior to the formation of the protection layers P2, and therefore, the condense lenses L and the conductive connectors C2 are covered and protected by the protection layers P2. In some embodiments, the protection layers P2 covering the condense lenses L and the conductive connectors C2 is optical transmissive such that the photoelectric integrated circuit dies PIC can transmit and/or receive optical signal. In some other embodiments, the protection layers P2 covering the condense lenses L and the conductive connectors C2 is not optical transmissive. In some alternative embodiments, the protection layers P2 may be omitted.

Figure 3:
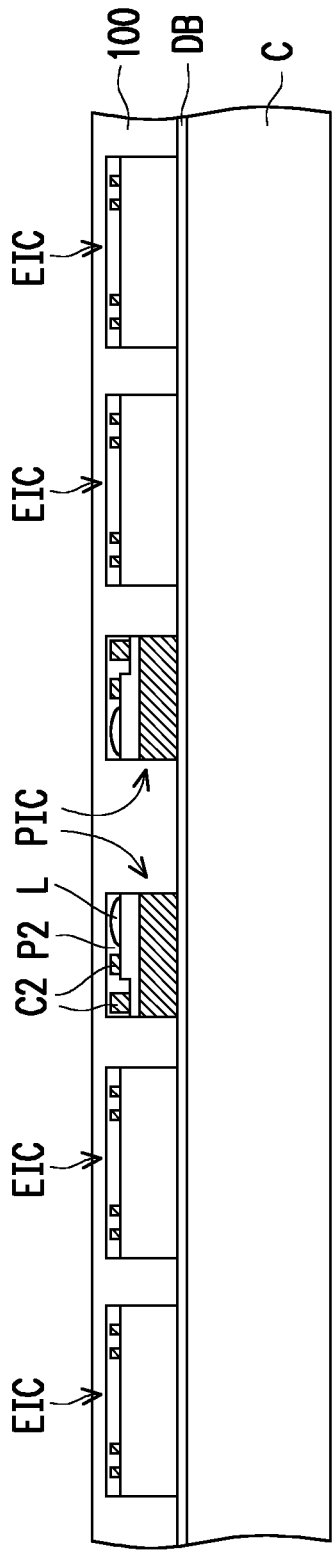

Referring to FIG. 3, an insulating material 100 is formed on the de-bonding layer DB to cover the electric integrated circuit dies EIC and the photoelectric integrated circuit dies PIC. In some embodiments, the insulating material 100 is a molding compound formed by an over-molding process (e.g., compression molding, transfer molding, or the like). Sidewalls and top surfaces of the electric integrated circuit dies EIC and the photoelectric integrated circuit dies PIC are covered by the insulating material 100. For example, the insulating material 100 includes epoxy or other suitable dielectric materials.

Figure 4:
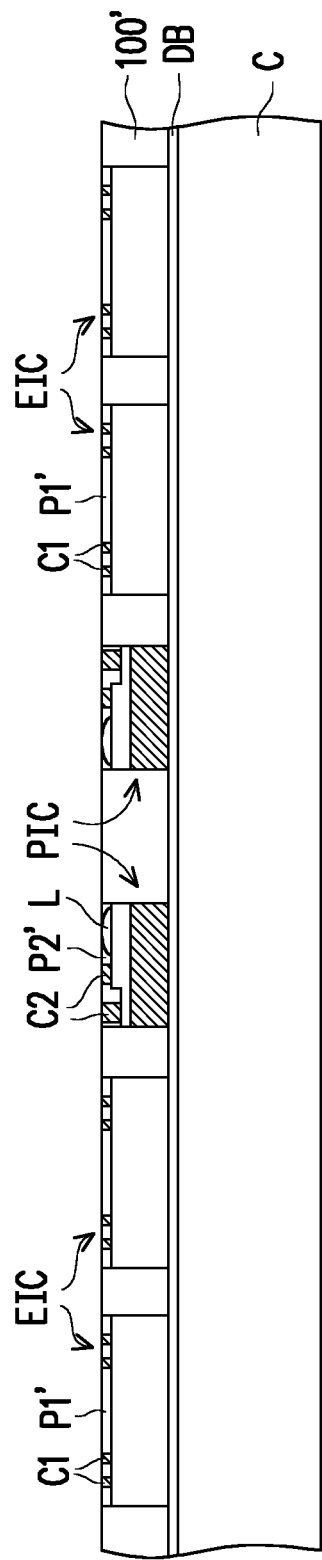

Referring to FIG. 3 and FIG. 4, the insulating material 100 is then ground to form an insulating encapsulation 100' such that the top surfaces of the conductive connectors C1 and C2 are exposed. The insulating encapsulation 100' laterally encapsulates the electric integrated circuit dies EIC and the photoelectric integrated circuit dies PIC. In some embodiments, the insulating material 100 is ground by a mechanical grinding process and/or a chemical mechanical polishing (CMP) process. After performing the grinding process, portions of the protection layers P1 and P2 are removed and protection layers P1' and P2' with reduced thickness are formed. As shown in FIG. 4, in some embodiments, the top surfaces of the conductive connetors C1 and C2, the top surface of the insulating encapsulation 100' and the top surface of the protection layers P1' and P2' are substantially leveled. In some alternative embodiments, the top surface of the insulating encapsulation 100' may not level with the top surface of the protection layers P1' and P2'.

In some embodiments, when the protection layers P2' is optical transmissive, the protection layers P2' are not removed after forming the insulating encapsulation 100'. In some other embodiments, when the protection layers P2' is not optical transmissive, the protection layers P2' are removed to expose the lenses L of the photoelectric integrated circuit dies PIC after forming the insulating encapsulation 100'.

Figure 5:
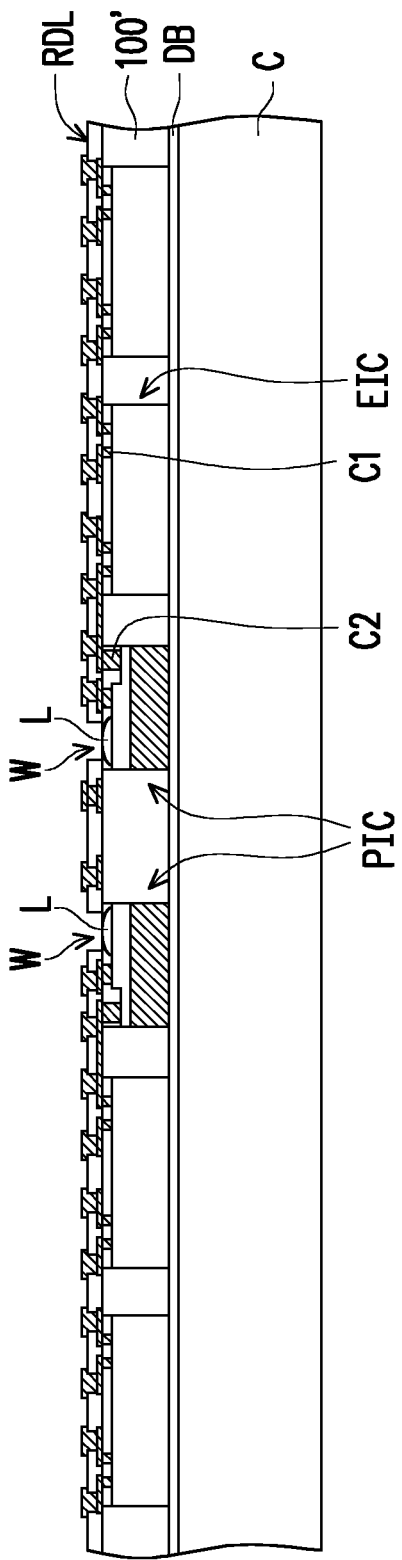

Referring to FIG. 4 and FIG. 5, after forming the insulating encapsulation 100' and the protection layers P1' and P2', a redistribution circuit layer RDL is formed on the insulating encapsulation 100', the electric integrated circuit dies EIC and the photoelectric integrated circuit dies PIC. The redistribution circuit layer RDL is electrically connected to the conductive connectors C1 of the electric integrated circuit dies EIC and the conductive connectors C2 of the photoelectric integrated circuit dies PIC. The redistribution circuit layer RDL includes optical windows W for optical transmission of the photoelectric integrated circuit dies PIC. In some embodiments, the optical windows W formed in the redistribution circuit layer RDL are located above the condense lenses L of the photoelectric integrated circuit dies PIC.

In FIG. 5, the redistribution circuit layer RDL including dielectric layers, metallization patterns, and under bump metallurgies (UBMs) is formed. The metallization patterns may also be referred to as redistribution layers or redistribution lines. The redistribution circuit layer RDL is shown as an example. More dielectric layers and metallization patterns may be formed in the redistribution circuit layer RDL. If more dielectric layers and metallization patterns are to be formed, steps and processes discussed below may be repeated here.

In some embodiments, the dielectric layer of the redistribution circuit layer RDL is formed of a photo-sensitive material, such as polybenzoxazole (PBO), polyimide, benzocyclobutene (BCB), or the like, which may be patterned using a lithography mask. The dielectric layer may be formed by spin coating, lamination, CVD, the like, or a combination thereof. The dielectric layer is then patterned. The patterning forms openings exposing portions of the conductive connectors C1 and C2. The patterning may be by an acceptable process, such as by exposing the dielectric layer to light when the dielectric layer is a photo-sensitive material or by etching using, for example, an anisotropic etch. If the dielectric layer is a photo-sensitive material, the dielectric layer can be developed after the exposure.

The metallization pattern of the redistribution circuit layer RDL may include conductive lines on and extending along the major surface of the dielectric layer. The metallization pattern may further include conductive vias extending through the dielectric layer. To form the metallization pattern, a seed layer is formed over the dielectric layer and in the via openings extending through the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process (e.g., wet or dry etching). Furthermore, the UBMs are formed to electrically connect the metallization pattern. The UBMs and the metallization pattern may be formed by similar processes.

As shown in FIG. 5, after the dielectric layer, the metallization pattern and the UBMs are formed, the redistribution circuit layer RDL is patterned such that optical windows W for optical transmission of the photoelectric integrated circuit dies PIC. Furthermore, the optical windows W is an empty space formed above the lenses L of the photoelectric integrated circuit dies PIC. In some other embodiments, after forming the optical windows W, optical transmissive material may be filled into the optical windows W.

Referring to FIG. 6, after forming the redistribution circuit layer RDL, a plurality of electrical input/output terminals 110 are formed over the UBMs of the redistribution circuit layer RDL. The electrical input/output terminals 110 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The electrical input/output terminals 110 may include a conductive material such as solder, copper, aluminum, gold, nickel, silver, palladium, tin, the like, or a combination thereof. In some embodiments, the electrical input/output terminals 110 are solder connectors that are formed by initially forming a layer of solder through commonly used methods such as evaporation, electroplating, printing, solder transfer, ball placement, or the like. Once a layer of solder has been formed on the redistribution circuit layer RDL, a reflow may be performed in order to shape the material into the desired ball or bump shapes. In another embodiment, the electrical input/output terminals 110 comprise metal pillars (such as a copper pillar) formed by a sputtering, printing, electro plating, electroless plating, chemical vapor deposition (CVD), or the like. The metal pillars may be solder free and have substantially vertical sidewalls.

Referring to FIG. 6 and FIG. 7, a carrier substrate de-bonding process is performed to detach or de-bond the carrier substrate C and the de-bonding layer DB from the wafer form structure which includes the electric integrated circuit dies EIC and photoelectric integrated circuit dies PIC and the insulating encapsulation 100'. In some embodiments, the de-bonding process includes irradiating a light such as a laser light or an UV light on the de-bonding layer DB so that the de-bonding layer DB decomposes under the heat of the light and the carrier substrate C can be removed. The wafer form structure including the electric integrated circuit dies EIC and photoelectric integrated circuit dies PIC, the insulating encapsulation 100' and the redistribution circuit layer RDL is then flipped over and placed on a tape.

Figure 8:
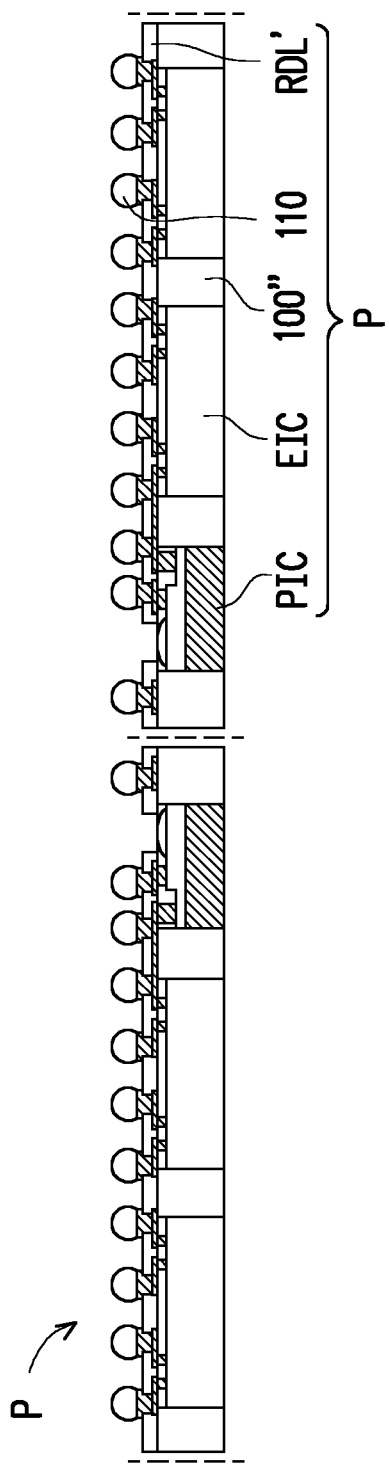

Referring to FIG. 8, a singulation process is performed to singulate the wafer form structure into a plurality of singulated fanout packages P. Each of the fanout packages P includes at least one electric integrated circuit die EIC and at least one photoelectric integrated circuit die PIC. Each of the fanout packages P may further include an insulating encapsulant 100" laterally encapsulating the electric integrated circuit die EIC and the photoelectric integrated circuit die PIC. In some embodiments, each of the fanout packages P may further include a redistribution circuit layer RDL', wherein the redistribution circuit layer RDL' covers the insulating encapsulant 100", the electric integrated circuit die EIC and the photoelectric integrated circuit die PIC, and the redistribution circuit layer RDL' is electrically connected to the electric integrated circuit die EIC and the photoelectric integrated circuit die PIC. In some embodiments, each of the fanout packages P may further include electrical input/output terminals 110 formed on the redistribution circuit layer RDL'.

In an embodiment where optical transmitters are fabricated, one photoelectric integrated circuit die PIC, such as an optical signal source, and multiple electric integrated circuit dies EIC, such as a SoC (Tx) die, one or more memory dies and a driver, may be included in one of the fanout packages P. For example, the optical signal source includes laser diode, such as a Vertical-Cavity Surface-Emitting Laser (VCSEL) diode or the like; and the memory dies include DRAM dies, SRAM dies or the like.

In an embodiment where optical receivers are fabricated, one photoelectric integrated circuit dies PIC, such as a photo-detector, and multiple electric integrated circuit dies EIC, such as a SoC (Rx) die, one or more memory dies and an amplifier, may be included in one of the fanout packages P. For example, the photo-detector includes a photo-diode; the memory dies include DRAM dies, SRAM dies or the like; and the amplifier includes a transimpedance amplifier (TIA) or the like.

Figure 9:
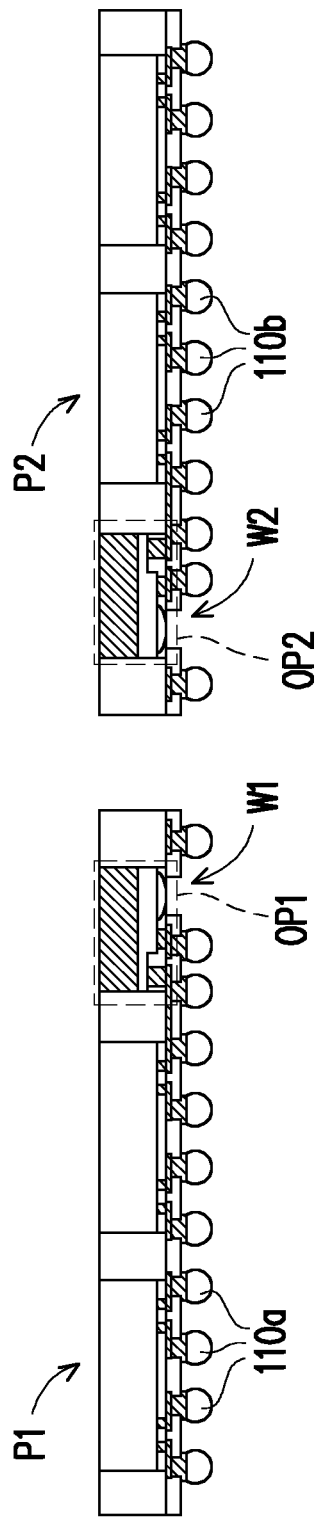
FIGS. 9 and 10 are cross-sectional views of intermediate steps of a process for forming a package structure in accordance with some embodiments.
Figure 10:
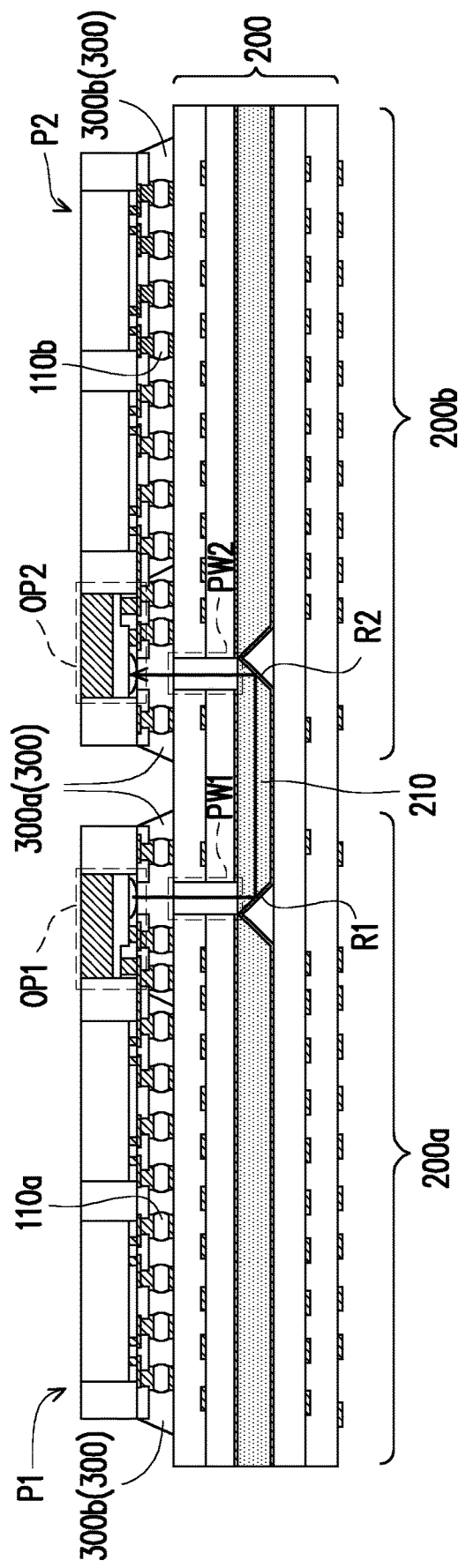

FIGS. 9 and 10 are cross-sectional views of intermediate steps of a process for forming a package structure in accordance with some embodiments.

Referring to FIG. 9, a first fanout package P1 serving as an optical transmitter and a second fanout package P2 serving as an optical receiver are provided. The first fanout package P1 includes a first optical input/output portion OP1 (i.e. an optical signal source) and first electrical input/output terminals 110a while the second fanout package P2 includes a second optical input/output portion OP2 (i.e. a photo-detector) and second electrical input/output terminals 110b. The first fanout package P1 and the second fanout package P2 may be fabricated by the processes illustrated in FIGS. 1 through 8.

Referring to FIG. 10, the first fanout package P1 and the second fanout package P2 are mounted over an electro-optical circuit board (EOCB) 200. The first fanout package P1 and the second fanout package P2 are electrically connected to the electro-optical circuit board 200 through the first electrical input/output terminals 110a and the second electrical input/output terminals 110b, respectively. In other words, the first fanout package P1 and the second fanout package P2 are electrically communicated with each other through the first electrical input/output terminals 110a, the second electrical input/output terminals 110b, and the electro-optical circuit board 200.

The electro-optical circuit board 200 includes an optical waveguide 210 embedded therein, wherein the first optical input/output portion OP1 (i.e. an optical signal source) of the first fanout package P1 is optically coupled to the second optical input/output portion OP2 (i.e. a photo-detector) of the second fanout package P2 through the optical waveguide 210 of the electro-optical circuit board 200. In some embodiments, the electro-optical circuit board 200 may include a first bonding region 200a and a second bonding region 200b, wherein the first fanout package P1 is mounted on the first bonding region 200a, the second fanout package is mounted on the second bonding region 200b, and the optical waveguide 210 extends below the first and second bonding regions 200a and 200b. In some embodiments, a first end of the optical waveguide 210 is located below the first optical input/output portion OP1 of the first fanout package P1, a second end of the optical waveguide 210 is located below the second optical input/output portion OP2 of the second fanout package P2, and the first and second ends of the optical waveguide 210 are opposite to each other. Furthermore, in some embodiments, a first reflector R1 may be disposed on the first end of the optical waveguide 210 and a second reflector R2 may be disposed on the second end of the optical waveguide 210 to facilitate the optical transmission of the optical signal between the first optical input/output portion OP1 of the first fanout package P1 and the second optical input/output portion OP2 of the second fanout package P2. The optical signal transmitted between the first optical input/output portion OP1 of the first fanout package P2 and the second optical input/output portion OP2 of the second fanout package P2 is reflected by the first reflector R1 and the second reflector R2. In an embodiment where the first fanout package P1 serves as an optical transmitter and the second fanout package P2 serves as an optical receiver, the optical signal transmitted from the first optical input/output portion OP1 of the first fanout package P2 is reflected by the first reflector R1, the reflected optical signal laterally propagates along the optical waveguide 210 from the first end to the second end, and then the reflected optical signal is reflected to the second optical input/output portion OP2 of the second fanout package P2 by the second reflector R2.

As shown in FIG. 10, in some embodiments, the electro-optical circuit board 200 may include the optical waveguide 210, build-up or laminated insulating films and metallization wirings formed between the insulating films, wherein the optical waveguide 210 may be sandwiched between the insulating films. The electro-optical circuit board 200 may include an optical passageway PW1 allowing optical transmission between the first end of the optical waveguide 210 and the first optical input/output portion OP1 (i.e. the photoelectric integrated circuit PIC in the first fanout package P1); and an optical passageway PW2 allowing optical transmission between the second end of the optical waveguide 210 and the second optical input/output portion OP2 (i.e. the photoelectric integrated circuit PIC in the second fanout package P2). Specifically, a first optical window W1 (shown in FIG. 9) of the first fanout package P1 and the optical passageway PW1 of the electro-optical circuit board 200 allowing optical transmission between the first end of the optical waveguide 210 and the first optical input/output portion OP1 (i.e. the photoelectric integrated circuit PIC in the first fanout package P1); and a second optical window W2 (shown in FIG. 9) of the second fanout package P2 and the optical passageway PW2 of the electro-optical circuit board 200 allowing optical transmission between the second end of the optical waveguide 210 and the second optical input/output portion OP2 (i.e. the photoelectric integrated circuit PIC in the second fanout package P2).

To enhance the reliability of the package structure illustrated in FIG. 10, an underfill 300 may be formed between the electro-optical circuit board 200 and the fanout packages P1 and P2 to encapsulate the electrical input/output terminals 110a and 110b. In some embodiments, the underfill 300 includes first portions 300a and second portions 300b, wherein the first portions 300a are in contact with the first optical input/output portion OP1 and the second optical input/output portion OP2, and the first portions 300a and the second portions 300a are formed by different dielectric materials. The first portions 300a may be filled into the optical passageway PW1 and PW2 and the optical windows W1 and W2. The first portions 300a are optical transmissive to the optical signal transmitted between the first optical input/output portion OP1 and the second optical input/output portion OP2. The second portions 300b may be in contact with the first portions 300a but not filled into the optical passageway PW1 and PW2 and the optical windows W1 and W2. Furthermore, the second portions 300b may be formed by dielectric materials which is optical transmissive or not. In some other embodiments, the underfill 300 may be formed by a single dielectric material which is optical transmissive to the optical signal transmitted between the first optical input/output portion OP1 and the second optical input/output portion OP2.

In the package structure illustrated in FIG. 10, the first fanout package P1 and the second fanout package P2 are optically communicated with each other through the optical waveguide 210 embedded in the electro-optical circuit board 200. Details regarding the optical communication between the first fanout package P1 and the second fanout package P2 are described in accompany with FIG. 11.

Figure 11:
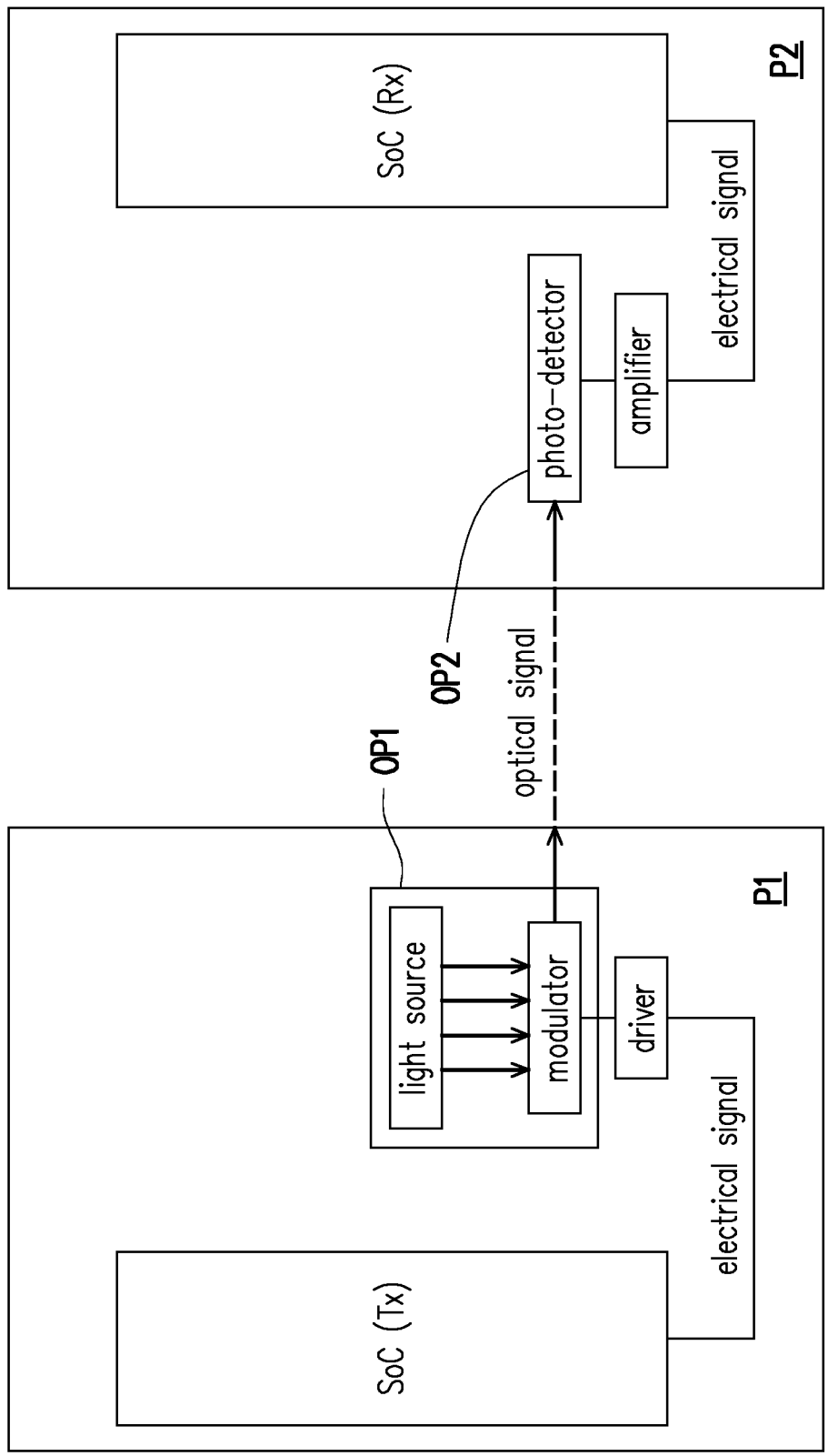
FIG. 11 is a schematic diagram illustrating optical communication in the package structure illustrated in FIG. 10.

FIG. 11 is a schematic diagram illustrating optical communication in the package structure illustrated in FIG. 10. Referring to FIG. 10 and FIG. 11, in an embodiment where the first fanout package P1 serves as a transmitter and the second fanout package P2 serves as a receiver, the first fanout package P1 may include a SoC (Tx) die, a driver, and an optical signal source (OP1); the optical signal source (OP1) may include a light source (e.g., a VCSEL diode) and a modulator; and the second fanout package P2 may include a SoC (Rx) die, an amplifier, and a photo-detector (0P2). During optical communication between the first fanout package P1 the second fanout package P2, the SoC (Tx) die generates and transmits an electrical signal to the driver, the driver controls the modulator in the optical signal source (OP1) based on the electrical signal generated from the SoC (Tx) dies of the first fanout package P1 such that the light beam emitted from the light source and irradiated onto the modulator can be modulated to generate an optical signal by the modulator. The optical signal generated by the modulator transmits to and received by the photo-detector (0P2). The photo-detector (0P2) converts the optical signal into a photo-current (another electric signal) and the photo-current is amplified by the amplifier. The amplified electrical signal is transmitted to the SoC (Rx) die of the second fanout package P2.

Figure 12:
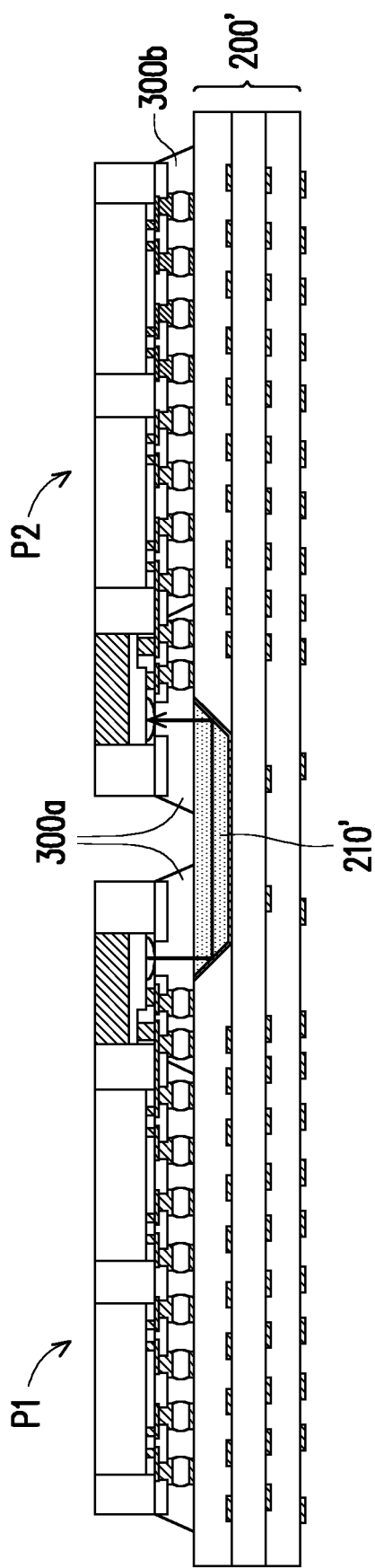
FIG. 12 is a cross-sectional view of a package structure in accordance with some other embodiments.

FIG. 12 is a cross-sectional view of a package structure in accordance with some other embodiments. Referring to FIG. 10 and FIG. 12, the package structure illustrated in FIG. 12 is similar with that illustrated in FIG. 10 except for the electro-optical circuit board 200'. The optical waveguide 210' is not embedded in the electro-optical circuit board 200'. The optical waveguide 210' is formed on a top surface of the electro-optical circuit board 200'.

FIGS. 1 through 7, FIG. 13, and FIG. 14 are cross-sectional views of intermediate steps of a process for forming another integrated fanout package in accordance with some embodiments. The details of the process illustrated in FIGS. 1 through 7 are omitted and not repeated here.

Figure 13:
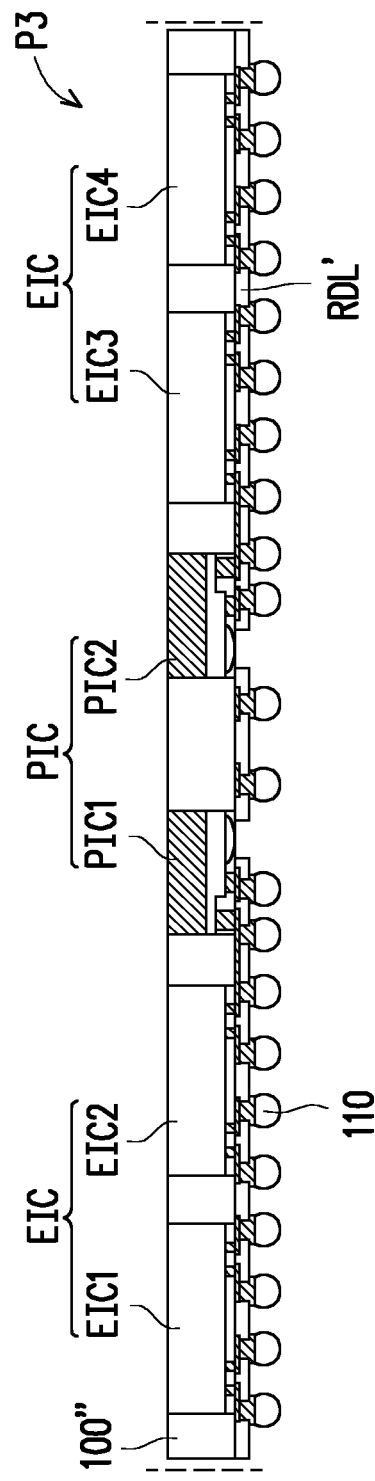

Referring to FIG. 13, after performing the carrier substrate de-bonding process illustrated in FIG. 7, a singulation process is performed to singulate the wafer form structure into a plurality of singulated fanout packages P3. Each of the fanout packages P3 includes multiple electric integrated circuit dies EIC (e.g., electric integrated circuit dies EIC1-EIC4) and multiple photoelectric integrated circuit dies PIC (e.g., photoelectric integrated circuit dies PIC1 and PIC2). Each of the fanout packages P3 may further include an insulating encapsulant 100" laterally encapsulating the electric integrated circuit dies EIC1-EIC4 and the photoelectric integrated circuit dies PIC1 and PIC2. In some embodiments, each of the fanout packages P may further include a redistribution circuit layer RDL', wherein the redistribution circuit layer RDL' covers the insulating encapsulant 100", the electric integrated circuit dies EIC1-EIC4 and the photoelectric integrated circuit dies PIC1 and PIC2, and the redistribution circuit layer RDL' is electrically connected to the electric integrated circuit dies EIC1-EIC4 and the photoelectric integrated circuit dies PIC1 and PIC2. In some embodiments, each of the fanout packages P3 may further include electrical input/output terminals 110 formed on the redistribution circuit layer RDL'.

As shown in FIG. 13, in an embodiment where optical transceivers are fabricated, multiple photoelectric integrated circuit dies PIC, such as a photo-detector PIC1 and an optical signal source PIC2, and multiple electric integrated circuit dies EIC, such as a SoC die EIC1 of transmitter (Tx), a SoC die EIC4 of receiver (Rx), one or more memory dies, a driver EIC2 and an amplifier EIC3, may be included in one of the fanout packages P. For example, the photo-detector PIC1 includes a photo-diode; the optical signal source PIC2 includes a laser diode, such as a Vertical-Cavity Surface-Emitting Laser (VCSEL) diode or the like; the memory dies include DRAM dies, SRAM dies or the like; and the amplifier includes a transimpedance amplifier (TIA) or the like.

Figure 14:
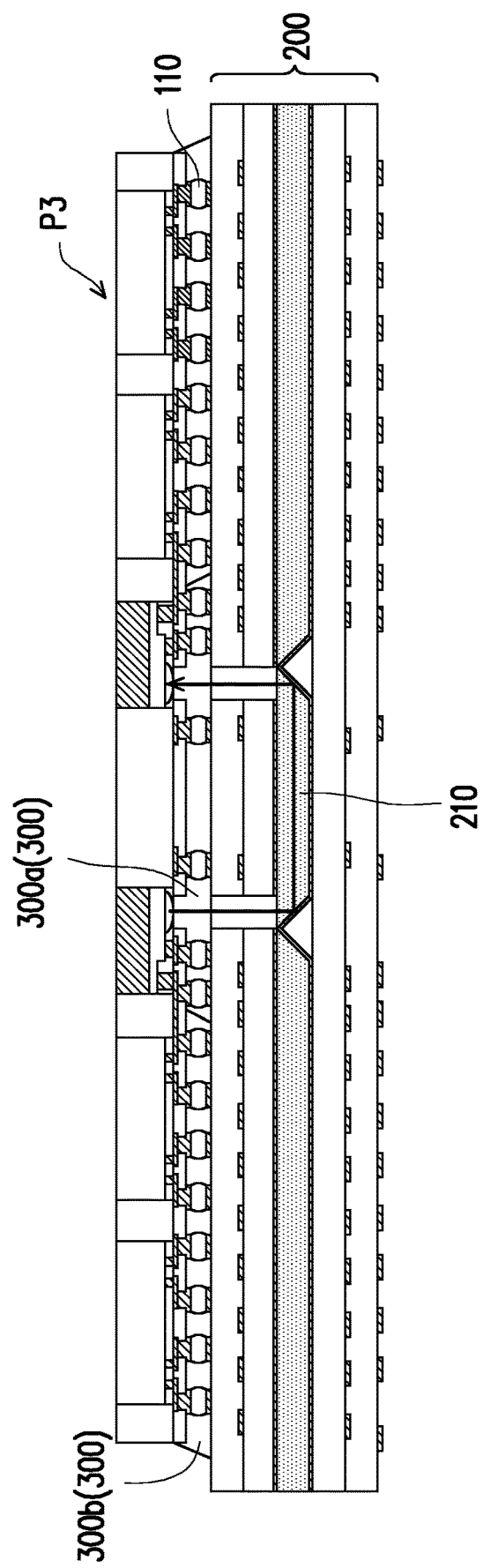

Referring to FIG. 14, the fanout package P3 is mounted over an electro-optical circuit board (EOCB) 200. The fanout package P3 is electrically connected to the electro-optical circuit board 200 through the electrical input/output terminals 110. The details of the electro-optical circuit board 200 are omitted and not repeated here.

The photo-detector PIC1 serves as the first optical input/output portion OP1 of the fanout package P3, and the optical signal source PIC2 serves as the second optical input/output portion OP2 of the fanout package P3.

To enhance the reliability of the package structure illustrated in FIG. 14, an underfill 300 may be formed between the electro-optical circuit board 200 and the fanout package P3 to encapsulate the electrical input/output terminals 110. In some embodiments, the underfill 300 includes a first portion 300a and second portions 300b, wherein the first portion 300a is in contact with the first optical input/output portion OP1 and the second optical input/output portion OP2, and the first portion 300a and the second portions 300a are formed by different dielectric materials. The first portion 300a is optical transmissive to the optical signal transmitted between the first optical input/output portion OP1 and the second optical input/output portion OP2. The second portions 300b may be in contact with the first portion 300a but not in contact with the first optical input/output portion OP1 and the second optical input/output portion OP2. Furthermore, the second portions 300b may be formed by dielectric materials which is optical transmissive or not. In some other embodiments, the underfill 300 may be formed by a single dielectric material which is optical transmissive to the optical signal transmitted between the first optical input/output portion OP1 and the second optical input/output portion OP2.

Figure 15:
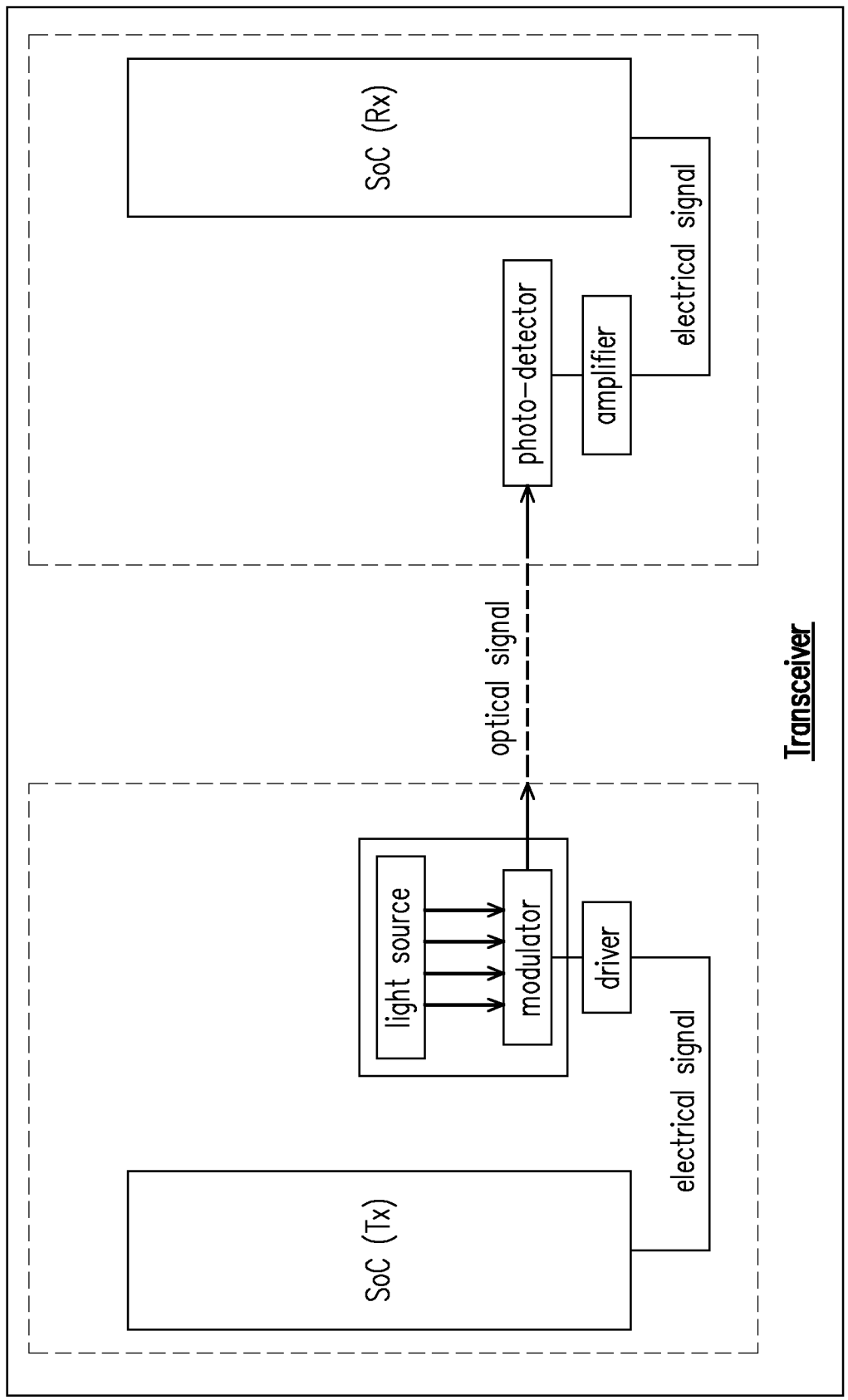
FIG. 15 is a schematic diagram illustrating optical communication in the package structure illustrated in FIG. 14.

In the package structure illustrated in FIG. 14, the first optical input/output portion OP1 and the second optical input/output portion OP2 of the fanout package P3 are optically communicated with each other through the optical waveguide 210 embedded in the electro-optical circuit board 200. Details regarding the optical communication between the first optical input/output portion OP1 and the second optical input/output portion OP2 are described in accompany with FIG. 15 which is similar with those described in FIG. 11. Thus, details of the optical communication between the first optical input/output portion OP1 and the second optical input/output portion OP2 are omitted and not repeated here.

Figure 16:
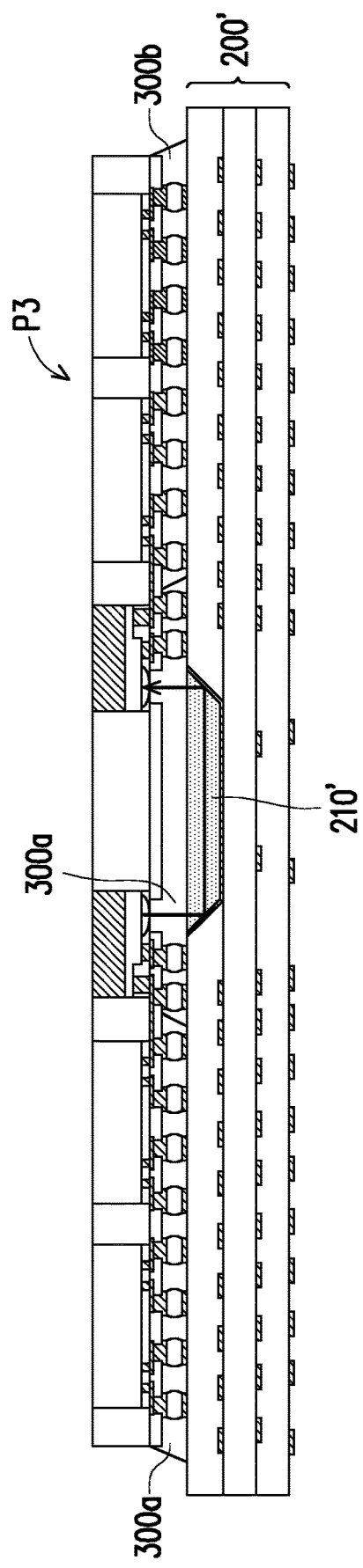
FIG. 16 is a cross-sectional view of a package structure in accordance with some other embodiments.
Figure 19:
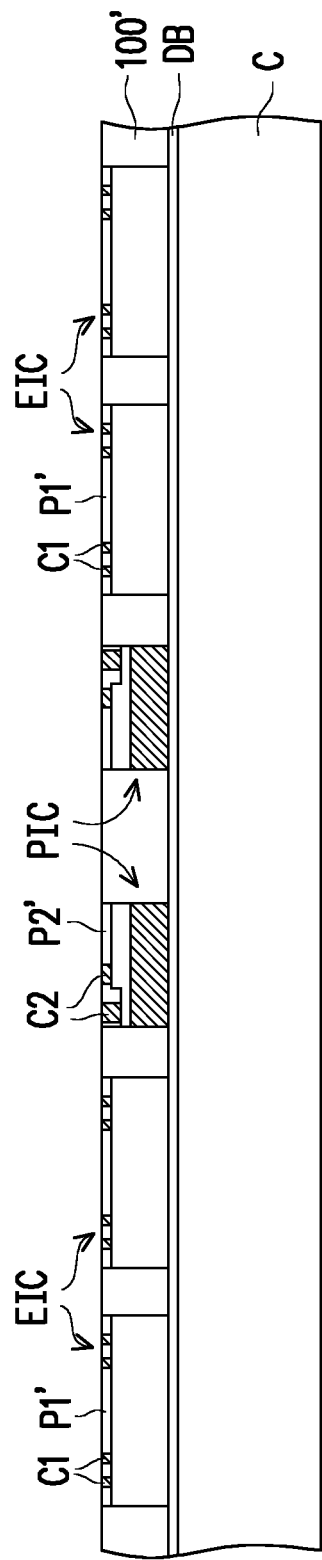
Figure 20:
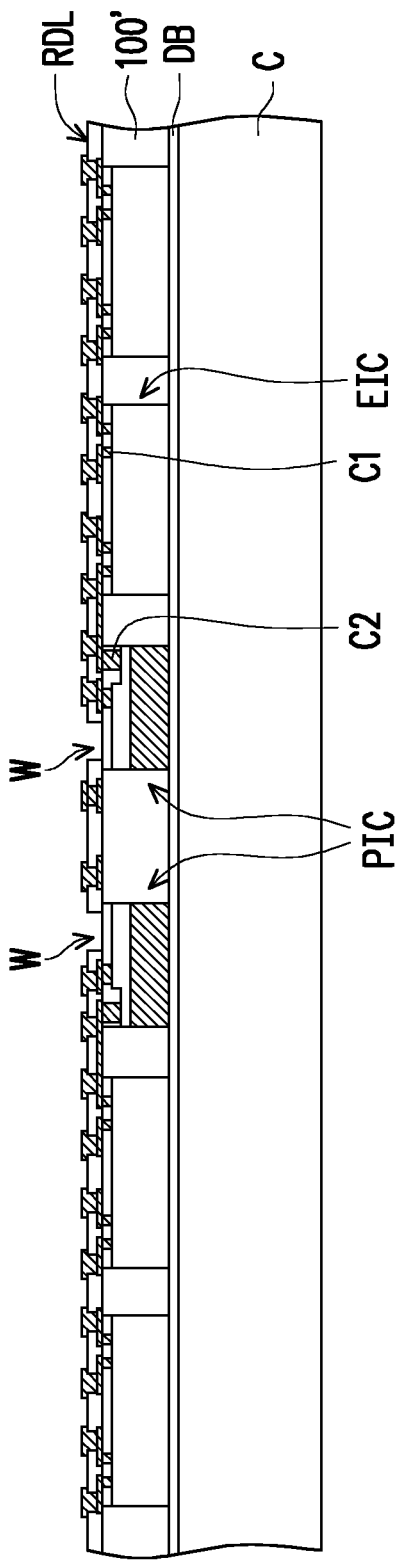

FIG. 16 is a cross-sectional view of a package structure in accordance with some other embodiments. Referring to FIG. 16, the package structure illustrated in FIG. 16 is similar with that illustrated in FIG. 14 except for the electro-optical circuit board 200'. The optical waveguide 210' is not embedded in the electro-optical circuit board 200'. The optical waveguide 210' is formed on a top surface of the electro-optical circuit board 200'.

FIGS. 17 through 25 are cross-sectional views of intermediate steps of a process for forming a package structure in accordance with some other embodiments. The intermediate steps of the process illustrated in FIGS. 17 through 24 are similar with those illustrated in FIGS. 2 through 10 except that lenses L are not formed in the photoelectric integrated circuit dies PIC in advance, as illustrated in FIGS. 17 through 20.

Figure 21:
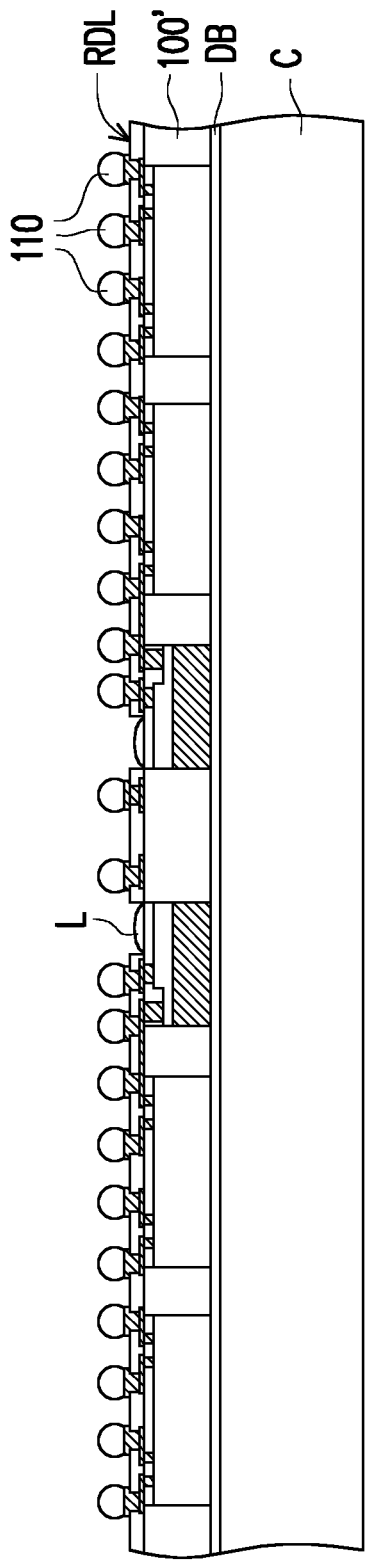
Figure 22:
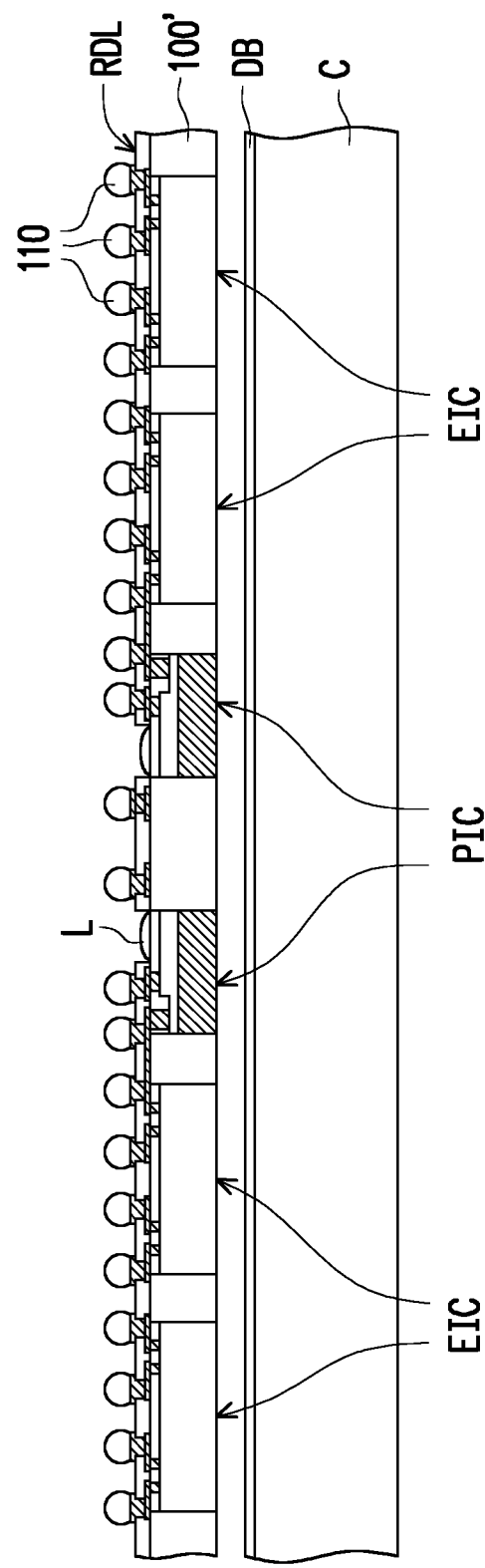
Figure 23:
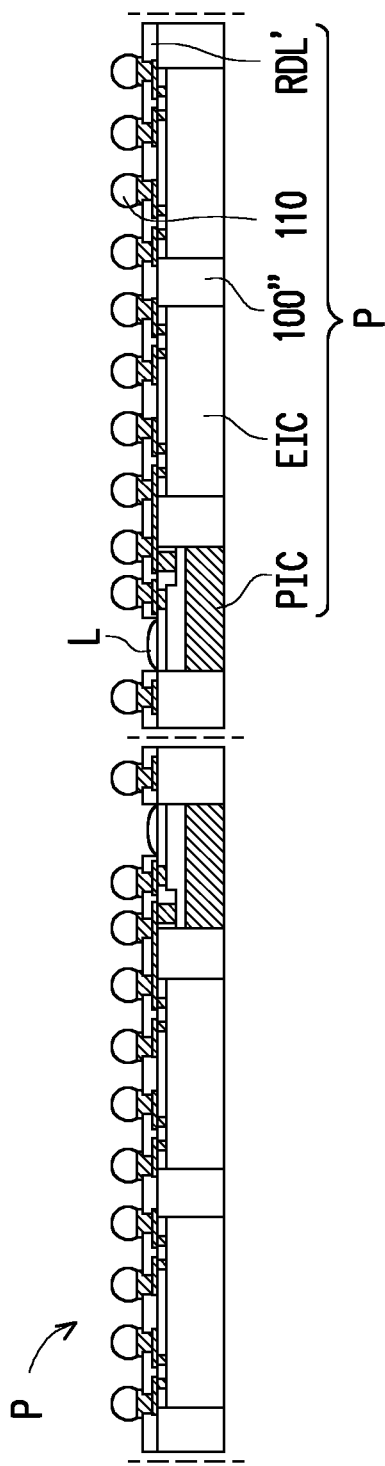
Figure 24:
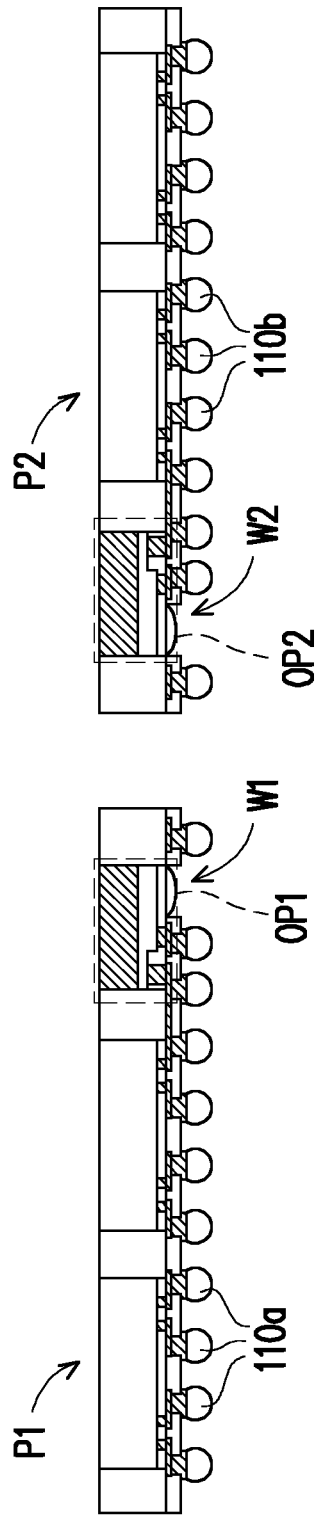
Figure 25:
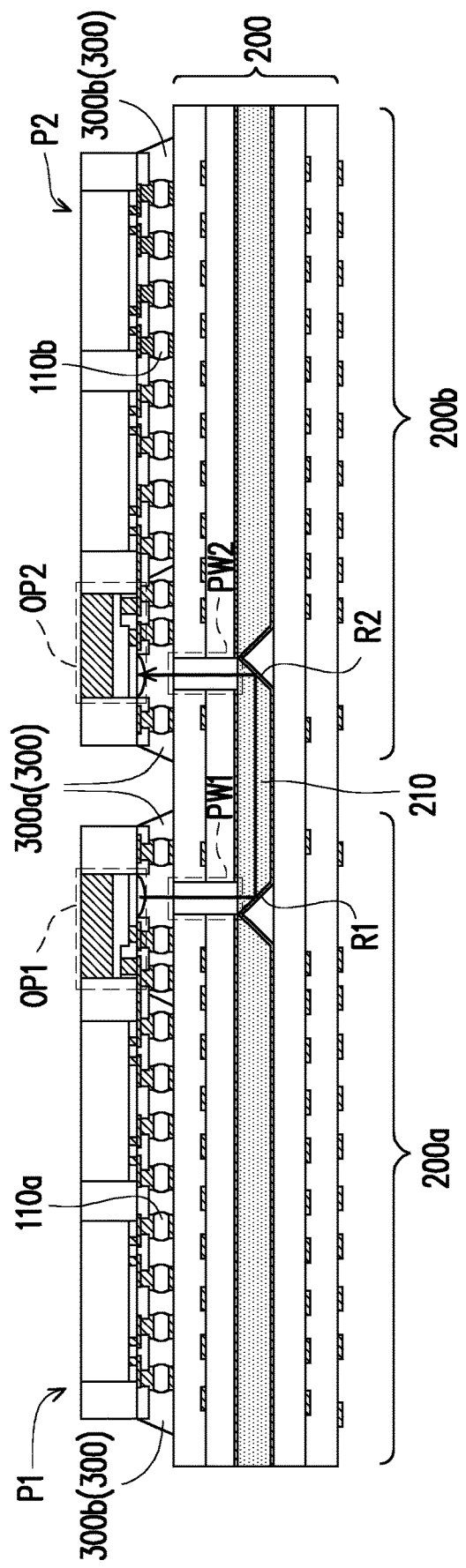

As illustrated in FIG. 21, the lenses L are formed over the photoelectric integrated circuit dies PIC after the optical windows W1 and W2 are formed in the redistribution circuit layer RDL. Furthermore, the lenses L are formed within the optical windows W1 and W2 defined by the redistribution circuit layer RDL. In some embodiments, the lenses L may be formed prior to the formation of the electrical input/output terminals 110. In some other embodiments, the lenses L may be formed after the formation of the electrical input/output terminals 110.

Figure 26:
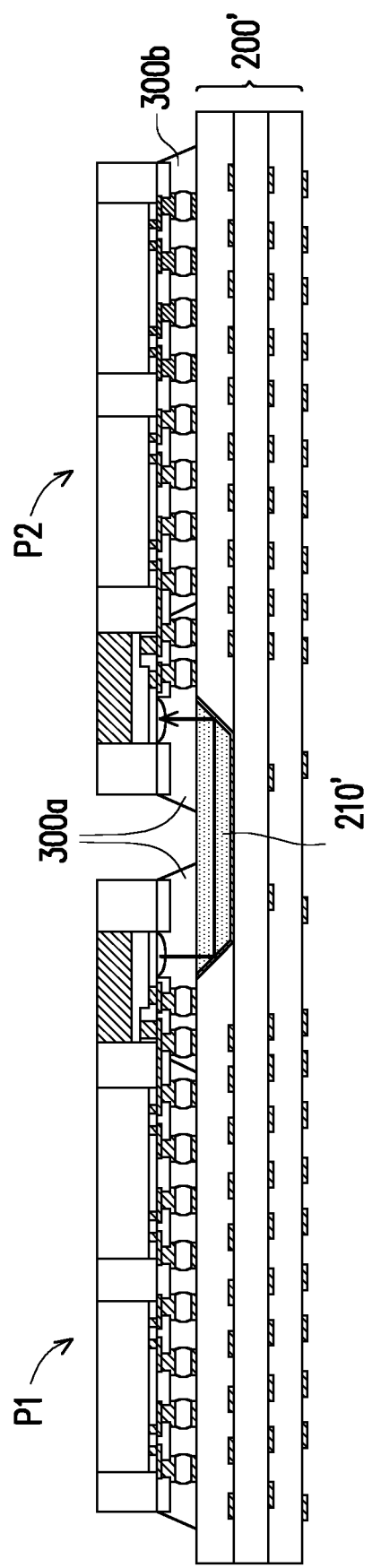
FIGS. 26 through 28 are cross-sectional views of various package structures in accordance with some alternative embodiments.
Figure 27:
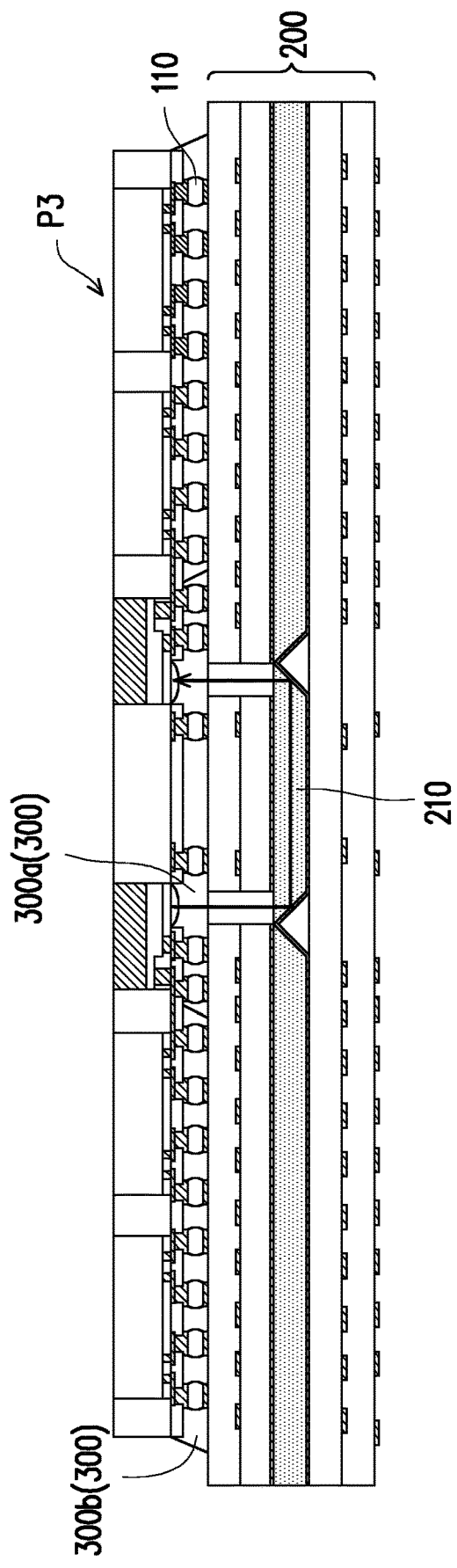
Figure 28:
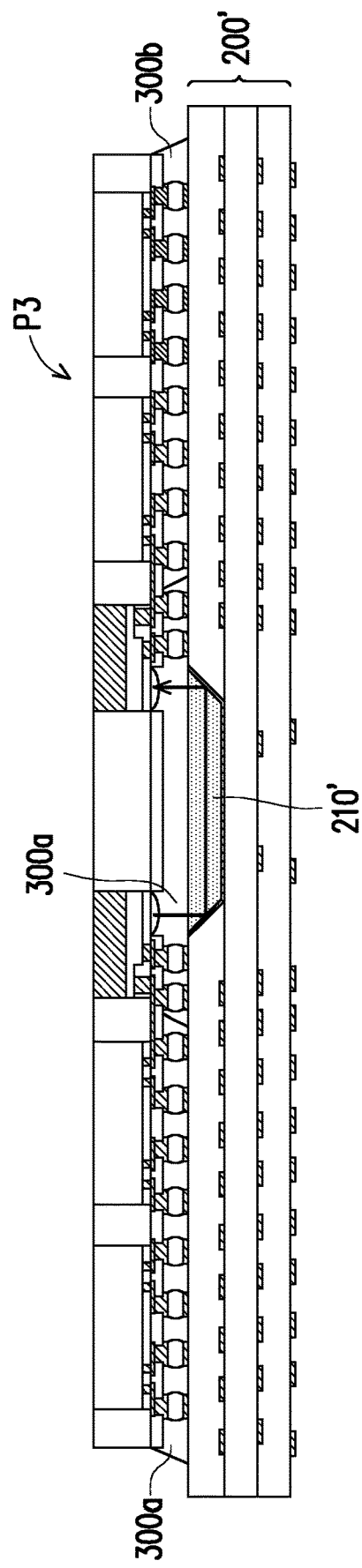

FIGS. 26 through 28 are cross-sectional views of various package structures in accordance with some alternative embodiments. The package structures illustrated in FIGS. 26, 27, and 28 are similar with those illustrated in FIGS. 12, 14, and 16 except that the lenses L is formed over the photoelectric integrated circuit dies PIC.

Embodiments may achieve advantages. The electro-optical circuit board for electrically connecting electric integrated circuit dies and optically coupling the photoelectric integrated circuit dies in one or more fanout packages may miniaturize package size and enhance data transmission rate of the package structure. Furthermore, the package structure may lower transmission cost.

In an embodiment, a package structure including an electro-optical circuit board, a fanout package disposed over the electro-optical circuit board is provided. The electro-optical circuit board includes an optical waveguide. The fanout package includes a first optical input/output portion, a second optical input/output portion and a plurality of electrical input/output terminals electrically connected to the electro-optical circuit board. The first optical input/output portion is optically coupled to the second optical input/output portion through the optical waveguide of the electro-optical circuit board.

In some embodiments, a first end of the optical waveguide is located below the first optical input/output portion, a second end of the optical waveguide is located below the second optical input/output portion, and the first end is opposite to the second end. In some embodiments, the optical waveguide is embedded in the electro-optical circuit board. In some embodiments, the fanout package and the optical waveguide are disposed on a surface of the electro-optical circuit board. In some embodiments, the package structure further includes a first reflector disposed on a first end of the optical waveguide and a second reflector disposed on a second end of the optical waveguide, wherein the first end is opposite to the second end, and optical signal transmitted between the first optical input/output portion and the second optical input/output portion is reflected by the first reflector and the second reflector. In some embodiments, the first optical input/output portion comprises an optical signal source and the second optical input/output portion comprises a photo-detector.

In an embodiment, a package structure including an electro-optical circuit board, a first fanout package disposed over the electro-optical circuit board and a second fanout package disposed over the electro-optical circuit board is provided. The electro-optical circuit board includes an optical waveguide. The first fanout package includes a first optical input/output portion and a first electrical input/output terminal electrically connected to the electro-optical circuit board. The second fanout package includes a second optical input/output portion and a second electrical input/output terminal electrically connected to the electro-optical circuit board. The first optical input/output portion of the first fanout package is optically coupled to the second optical input/output portion of the second fanout package through the optical waveguide of the electro-optical circuit board.

In some embodiments, the electro-optical circuit board comprises a first bonding region and a second bonding region, the first and second fanout package are mounted on the first and second bonding regions respectively, and the optical waveguide extend below the first and second bonding regions. In some embodiments, a first end of the optical waveguide is located below the first optical input/output portion of the first fanout package, a second end of the optical waveguide is located below the second optical input/output portion of the second fanout package, and the first end is opposite to the second end. In some embodiments, the optical waveguide is embedded in the electro-optical circuit board. In some embodiments, the first fanout package, the second fanout package and the optical waveguide are disposed on a surface of the electro-optical circuit board. In some embodiments, the package structure further includes a first reflector disposed on a first end of the optical waveguide and a second reflector disposed on a second end of the optical waveguide, wherein the first end is opposite to the second end, wherein optical signal transmitted between the first optical input/output portion of the first fanout package and the second optical input/output portion of the second fanout package is reflected by the first reflector and the second reflector. In some embodiments, the first optical input/output portion comprises an optical signal source and the second optical input/output portion comprises a photo-detector.

In an embodiment, a package structure including an electro-optical circuit board, a first fanout package disposed over the electro-optical circuit board and a second fanout package disposed over the electro-optical circuit board is provided. The electro-optical circuit board includes an optical waveguide. The first fanout package includes a first photoelectric integrated circuit die optically coupled to the optical waveguide of the electro-optical circuit board and a first electric integrated circuit die electrically connected to the electro-optical circuit board. The second fanout package includes a second photoelectric integrated circuit die optically coupled to the optical waveguide of the electro-optical circuit board and a second electric integrated circuit die electrically connected to the electro-optical circuit board.

In some embodiments, the first electric integrated circuit die is electrically communicated with the second electric integrated circuit die, and the first photoelectric integrated circuit die is optically communicated with the second photoelectric integrated circuit die through the optical waveguide of the electro-optical circuit board. In some embodiments, the first photoelectric integrated circuit die is electrically connected to the first electric integrated circuit die, and the second photoelectric integrated circuit die is electrically connected to the second electric integrated circuit die. In some embodiments, the first fanout package further includes a first encapsulant laterally encapsulating the first photoelectric integrated circuit die and the first electric integrated circuit die and a first redistribution circuit layer disposed on the first encapsulant, the first photoelectric integrated circuit die and the first electric integrated circuit die, wherein the first redistribution circuit layer is electrically connected to the first electric integrated circuit die. In some embodiments, the redistribution circuit layer includes a first optical window allowing optical transmission between a first end of the optical waveguide and the first photoelectric integrated circuit. In some embodiments, the second fanout package further includes a second encapsulant laterally encapsulating the second photoelectric integrated circuit die and the second electric integrated circuit die and a second redistribution circuit layer disposed on the second encapsulant, the second photoelectric integrated circuit die and the second electric integrated circuit die, wherein the second redistribution circuit layer is electrically connected to the second electric integrated circuit die. In some embodiments, the redistribution circuit layer includes a second optical window allowing optical transmission between a second end of the optical waveguide and the second photoelectric integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
an electro-optical circuit board comprising an optical waveguide;
a fanout package disposed over the electro-optical circuit board, the fanout package comprising an insulating encapsulant, photoelectric integrated circuit dies in contact with and encapsulated by the insulating encapsulant, and electric integrated circuit dies in contact with and encapsulated by the insulating encapsulant, a surface of the insulating encapsulant being substantially leveled with active sides of the photoelectric integrated circuit dies and the electric integrated circuit dies, the electric integrated circuit dies being electrically connected to the electro-optical circuit board, and the photoelectric integrated circuit dies being optically coupled to each other through the optical waveguide of the electro-optical circuit board, wherein the electric integrated circuit dies are spaced apart from the photoelectric integrated circuit dies by the insulating encapsulant.

2. The package structure of claim 1, wherein a first end of the optical waveguide is located below the fanout package, a second end of the optical waveguide is located below the fanout package, and the first end is opposite to the second end.

3. The package structure of claim 1, wherein the optical waveguide is embedded in the electro-optical circuit board.

4. The package structure of claim 1, wherein the fanout package and the optical waveguide are disposed on a surface of the electro-optical circuit board.

5. The package structure of claim 1 further comprising:
a first reflector disposed on a first end of the optical waveguide; and
a second reflector disposed on a second end of the optical waveguide, the first end being opposite to the second end,
wherein optical signal transmitted between the first fanout package and the second fanout package is reflected by the first reflector and the second reflector.

6. The package structure of claim 1, wherein the first fanout package comprises a first optical input/output portion, the second fanout package comprises a second optical input/output portion, the first optical input/output portion comprises an optical signal source and the second optical input/output portion comprises a photo-detector.

7. A package structure, comprising:
an electro-optical circuit board comprising an optical waveguide;
a first fanout package disposed over the electro-optical circuit board, the first fanout package comprising a first insulating encapsulant and first integrated circuit dies encapsulated by the first insulating encapsulant, wherein a first surface of the first insulating encapsulant is substantially leveled with first active sides of the first integrated circuit dies, and the first integrated circuit dies are spaced apart from each other by the first insulating encapsulant; and
a second fanout package disposed over the electro-optical circuit board, the second fanout package comprising a second insulating encapsulant and second integrated circuit dies encapsulated by the second insulating encapsulant, wherein a second surface of the second insulating encapsulant is substantially leveled with second active sides of and the second integrated circuit dies, the second integrated circuit dies are spaced apart from each other by the second insulating encapsulant, and the first fanout package is optically coupled to the second fanout package through the optical waveguide of the electro-optical circuit board.

8. The package structure of claim 7, wherein the electro-optical circuit board comprises a first bonding region and a second bonding region, the first and second fanout packages are mounted on the first and second bonding regions respectively, and the optical waveguide extends below the first and second bonding regions.

9. The package structure of claim 7, wherein a first end of the optical waveguide is located below the first fanout package, a second end of the optical waveguide is located below the second fanout package, and the first end is opposite to the second end.

10. The package structure of claim 7, wherein the optical waveguide is embedded in the electro-optical circuit board.

11. The package structure of claim 7, wherein the first fanout package, the second fanout package and the optical waveguide are disposed on a surface of the electro-optical circuit board.

12. The package structure of claim 7 further comprising:
a first reflector disposed on a first end of the optical waveguide; and
a second reflector disposed on a second end of the optical waveguide, the first end being opposite to the second end,
wherein optical signal transmitted between the first fanout package and the second fanout package is reflected by the first reflector and the second reflector.

13. The package structure of claim 7, wherein the first fanout package comprises a first optical input/output portion, the second fanout package comprises a second optical input/output portion, the first optical input/output portion comprises an optical signal source, and the second optical input/output portion comprises a photo-detector.

14. A package structure, comprising:
an electro-optical circuit board comprising an optical waveguide;
a first fanout package disposed over the electro-optical circuit board, the first fanout package comprising a first photoelectric integrated circuit die optically coupled to the optical waveguide of the electro-optical circuit board and a first electric integrated circuit die electrically connected to the electro-optical circuit board, and the first electric integrated circuit die being spaced apart from the first photoelectric integrated circuit die by the first insulating encapsulant; and
a second fanout package disposed over the electro-optical circuit board, the second fanout package comprising a second photoelectric integrated circuit die optically coupled to the optical waveguide of the electro-optical circuit board and a second electric integrated circuit die electrically connected to the electro-optical circuit board.

15. The package structure of claim 14, wherein the first electric integrated circuit die is electrically communicated with the second electric integrated circuit die, and the first photoelectric integrated circuit die is optically communicated with the second photoelectric integrated circuit die through the optical waveguide of the electro-optical circuit board.

16. The package structure of claim 14, wherein the first photoelectric integrated circuit die is electrically connected to the first electric integrated circuit die, and the second photoelectric integrated circuit die is electrically connected to the second electric integrated circuit die.

17. The package structure of claim 14, wherein the first fanout package further comprises:
a first insulating encapsulant laterally encapsulating the first photoelectric integrated circuit die and the first electric integrated circuit die; and
a first redistribution circuit layer disposed on the first insulating encapsulant, the first photoelectric integrated circuit die and the first electric integrated circuit die, and the first redistribution circuit layer being electrically connected to the first electric integrated circuit die.

18. The package structure of claim 17, wherein the first redistribution circuit layer comprises a first optical window allowing optical transmission between a first end of the optical waveguide and the first photoelectric integrated circuit.

19. The package structure of claim 14, wherein the second fanout package further comprises:
a second insulating encapsulant laterally encapsulating the second photoelectric integrated circuit die and the second electric integrated circuit die, wherein the second electric integrated circuit die is spaced apart from the second photoelectric integrated circuit die by the second insulating encapsulant; and
a second redistribution circuit layer disposed on the second insulating encapsulant, the second photoelectric integrated circuit die and the second electric integrated circuit die, and the second redistribution circuit layer being electrically connected to the second electric integrated circuit die.

20. The package structure of claim 19, wherein the second redistribution circuit layer comprises a second optical window allowing optical transmission between a second end of the optical waveguide and the second photoelectric integrated circuit.

* * * * *